(12) United States Patent
Devaramani et al.

(10) Patent No.: US 9,419,081 B2
(45) Date of Patent: Aug. 16, 2016

(54) REUSABLE SUBSTRATE BASES, SEMICONDUCTOR DEVICES USING SUCH REUSABLE SUBSTRATE BASES, AND METHODS FOR MAKING THE REUSABLE SUBSTRATE BASES

(71) Applicant: HONEYWELL INTERNATIONAL INC., Morristown, NJ (US)

(72) Inventors: Basavaraja Sangappa Devaramani, Karnataka (IN); Raju Addepalle Raghurama, Karnataka (IN); John Stokely, Albuquerque, NM (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 75 days.

(21) Appl. No.: 14/465,016

(22) Filed: Aug. 21, 2014

(65) Prior Publication Data

US 2016/0056243 A1 Feb. 25, 2016

(51) Int. Cl.
*H01L 33/00* (2010.01)
*H01L 29/20* (2006.01)
(Continued)

(52) U.S. Cl.
CPC ........ *H01L 29/2003* (2013.01); *H01L 21/0259* (2013.01); *H01L 21/0262* (2013.01); *H01L 21/02381* (2013.01); *H01L 21/02433* (2013.01); *H01L 21/02458* (2013.01); *H01L 21/02507* (2013.01); *H01L 21/02554* (2013.01);
(Continued)

(58) Field of Classification Search
CPC ................... H01L 21/02507; H01L 21/02505; H01L 21/7813; H01L 33/12; H01L 33/0087; H01L 33/0079
See application file for complete search history.

(56) References Cited

U.S. PATENT DOCUMENTS 6,818,061 B2 11/2004 Peczalski et al.
7,989,244 B2 8/2011 Kim et al.
(Continued)

FOREIGN PATENT DOCUMENTS

CN 102255026 B 8/2013
FR 2978601 A1 2/2013

OTHER PUBLICATIONS

Bayram, C. et al.; Engineering future light emitting diodes and photovoltaics with inexpensive materials: Integrating ZnO and Si into GaN-based devices; Proc. of SPIE vol. 8626, 86260L—© 2013 SPIE—CCC code: 0277-786X/13.
(Continued)

*Primary Examiner* — John C Ingham
*Assistant Examiner* — Frederick B Hargrove
(74) *Attorney, Agent, or Firm* — Ingrassia, Fisher & Lorenz, P.C.

(57) ABSTRACT

Reusable substrate bases for producing multilayer semiconductor devices are provided, as well as free-standing semiconductor devices and reusable substrate bases produced for the multilayer semiconductor devices. The reusable substrate bases comprise a Si-based substrate, a transition lattice overlayed thereon, and a sacrificial ZnO-based layer overlayed on the transition lattice. The transition lattice comprises alternating transition layers of aluminum nitride (AlN) and GaN or Al-doped GaN. The multilayer semiconductor devices comprise the aforesaid reusable substrate bases and a semiconductor stack which comprises a pair of p-n junction forming layers. Methods for producing the multilayer semiconductor devices, the reusable substrate base, as well as free standing semiconductor devices detached from the reusable substrate bases, are also provided.

15 Claims, 2 Drawing Sheets

(51) Int. Cl.
*H01L 21/02* (2006.01)
*H01L 33/32* (2010.01)

(52) U.S. Cl.
CPC .... *H01L21/02576* (2013.01); *H01L 21/02579* (2013.01); *H01L 21/02664* (2013.01); *H01L 33/007* (2013.01); *H01L 33/0079* (2013.01); *H01L 33/32* (2013.01)

(56) References Cited

U.S. PATENT DOCUMENTS

| | | | |
|---|---|---|---|
| 8,278,194 B2 | 10/2012 | Wuu et al. | |
| 8,278,656 B2 | 10/2012 | Mattmann et al. | |
| 8,395,152 B2 | 3/2013 | Rao et al. | |
| 8,435,816 B2 | 5/2013 | Xiong et al. | |
| 8,709,839 B2 | 4/2014 | Lee et al. | |
| 9,231,053 B2 | 1/2016 | Raghurama et al. | |
| 2006/0081873 A1* | 4/2006 | Osinsky | H01L 33/14 257/183 |
| 2007/0111368 A1 | 5/2007 | Zhang et al. | |
| 2009/0267188 A1 | 10/2009 | Piner et al. | |
| 2010/0117070 A1 | 5/2010 | Adekore et al. | |
| 2011/0049506 A1* | 3/2011 | Rao | C23C 14/086 257/43 |
| 2011/0284061 A1 | 11/2011 | Vanecek et al. | |
| 2012/0055532 A1 | 3/2012 | Wang et al. | |
| 2012/0061660 A1 | 3/2012 | Lu et al. | |
| 2012/0146020 A1 | 6/2012 | Ryu et al. | |
| 2012/0309172 A1* | 12/2012 | Romano | H01L 21/02002 438/478 |
| 2013/0109108 A1 | 5/2013 | Lin et al. | |
| 2013/0187124 A1 | 7/2013 | Zhang et al. | |
| 2013/0187127 A1 | 7/2013 | Yi et al. | |
| 2014/0332849 A1* | 11/2014 | Jang | H01L 29/7783 257/190 |

OTHER PUBLICATIONS

Rajan, A. et al.; Novel Method for Reclaim/Reuse of Bulk GaN Substrates using Sacrifical ZnO Release Layers; Proc. of SPIE vol. 8987 898719-1; © 2014 SPIE CCC code: 0277-786X/14.

Rogers, D.J. et al.; Novel Process for Direct Bonding of GaN onto Glass Substrates using Sacrificial ZnO Template Layers to Chemically Lift-off GaN from c-sapphire; Proc. of SPIE vol. 8263, 82630R—© 2012 SPIE—CCC code: 0277-786X/12.

Chuang, S. et al.; Thin Film GaN LEDs Using a Patterned Oxide Sacrificial Layer by Chemical Lift-Off Process; IEEE Photonics Technology Letters, Vol. 25, No. 24, Dec. 15, 2013.

Wei, X. et al.; Fabrication and Properties of ZnO/GaN Heterostructure Nanocolumnar Thin Film on Si (111) Substrate; Nanoscale Research Letters, a SpringerOpen Journal; Wei et al. Nanoscale Research Letters 2013, 8:112.

Abbasi, M. A. et al.; The Fabrication of White Light-Emitting Diodes Using the n—ZnO/NiO/p—GaN Heterojunction with Enhanced Luminescence; Nanoscale Research Letters, a SpringerOpen Journal; Abbasi et al. Nanoscale Research Letters 2013, 8:320.

Kim, J. et al.; Highly Efficient InGaN/GaN Blue LED on 8-inch Si (111) Substrate; Proc. of SPIE vol. 8262 82621D-1; 2012 SPIE CCC code: 0277-786X/12.

Onomura, M.; Highly Efficient InGaN MQW LEDs Grown on 200 mm Si Substrates; Proc. of SPIE vol. 8986 898620-1; 2014 SPIE CCC code: 0277-786X/14.

USPTO Office Action, Notification Date May 14, 2015; U.S. Appl. No. 14/314,177.

* cited by examiner

REUSABLE SUBSTRATE BASES, SEMICONDUCTOR DEVICES USING SUCH REUSABLE SUBSTRATE BASES, AND METHODS FOR MAKING THE REUSABLE SUBSTRATE BASES

TECHNICAL FIELD

The disclosure generally relates to semiconductor devices and methods for making semiconductor devices. More particularly, the disclosure relates to reusable substrate bases for producing multilayer semiconductor devices, and methods for making reusable substrates.

BACKGROUND

Semiconductor devices having metal oxide layers of adjacent epitaxial p-type and n-type structures that form p-n junctions are known as semiconductor diodes, or p-n diodes. Such devices are useful as light emitting diodes (LEDs) and power transistors. The further development of this technology has enabled semiconductor diode efficiency to rise exponentially, making them more widely useful in various applications. Among recent research trends are those that seek to reduce costs of producing semiconductor diodes, while enlarging the diode surface area and maintaining high performance and efficiency.

Generally, semiconductor diodes are manufactured using single crystal substrates of GaN, ZnO, $Al_2O_3$ (sapphire), SiC, $SiO_2$ (quartz) and silicon. Large area substrates (e.g., greater than about 15.24 centimeters (cm) (6 inches)) of single crystal GaN and ZnO are not widely used due to their high cost, even though their lattice matching with p-type and n-type films is almost equal, which permits growth of superior quality single crystalline epitaxial films for making the best LEDs.

Silicon is known to be among the least costly of the suitable semiconductor substrate materials, with high quality single crystal wafers having large surface area with about 20.32 cm (8 inches) to about 30.48 cm (12 inches) in diameter, or greater, available for deposition of metal oxide layers thereon. However, silicon substrates have their own drawbacks, including large lattice mismatch and increased warping as their surface area increases. This hinders growth of high quality epitaxial layers of GaN, ZnO, or other oxides thereon and subjects the deposited epitaxial layers to stress that increases the risk of defects or other distortion of the crystal structures.

Many techniques have been developed to reduce the lattice mismatch, such as first depositing MgO thin layers on the Si-based substrate, then growing an AlGaN layer, and finally depositing GaN p- and n-type epitaxial layers. Still, there remain unacceptable degrees of defects in the quality of the epitaxial layers, which reduce the efficiency of semiconductor diodes produced this way.

Additionally, after formation of the p- and n-type epitaxial layers, the substrate and possibly one or more of the intermediate layers, sometimes referred to as sacrificial layers, may be separated from the p- and n-type epitaxial layers to produce a free standing semiconductor device and a "reusable substrate" that can be used again to form another semiconductor device. The free standing semiconductor device has a smaller thickness, which may be advantageous depending on how and where the semiconductor device will be used. Thus, layers that were beneficial while forming the p- and n-type epitaxial layers of the semiconductor device, but which are unnecessary for its ongoing operation, have been removed. Some methods of removing sacrificial layers will not damage the substrate and, therefore, enable reuse of the substrate to grow new semiconductor layers. However, the reusable substrate will still present the same challenge during reuse as it originally presented, that is, large lattice mismatch that hinders growth of high quality epitaxial layers thereon.

Accordingly, it is desirable to provide high quality reusable substrate bases that use less expensive Si-based substrates and that permit the growth of high quality epitaxial layers thereon, notwithstanding the lattice mismatch between Si and GaN. In addition, it is desirable to provide semiconductor devices that use such reusable substrates. It is also desirable to provide methods for preparing such high quality multilayer semiconductor devices which can be subjected to a separation procedure to produce reusable substrate bases having Si-based substrates and free standing semiconductor devices. Other desirable features and characteristics of the present invention will become apparent from the subsequent detailed description of the invention and the appended claims, taken in conjunction with the accompanying drawings and this background of the invention.

BRIEF SUMMARY

A reusable substrate base is useful for production of semiconductor devices is provided. More particularly, the reusable substrate comprises: a Si-based substrate; and a transition lattice overlaying said Si-based substrate and comprising two or more alternating transition layers, wherein the alternating transition layers comprise a first transition layer that comprises AlN and that overlays said Si-based substrate, and a second transition layer that comprises either GaN or GaN doped with Al, and that overlays said first transition layer comprising AlN.

A multilayer semiconductor device is also provided and comprises: a reusable substrate base comprising: a Si-based substrate; a transition lattice overlaying said Si-based substrate and comprising two or more alternating transition layers, wherein a first transition layer comprises AlN and overlays said Si-based substrate, and a second transition layer comprises either GaN or GaN doped with Al, and overlays said first transition layer comprising AlN; and a sacrificial ZnO-based layer which overlays said transition lattice. Furthermore, the multilayer semiconductor device also comprises: a semiconductor stack comprising a pair of adjacent p-n junction forming layers overlaying said ZnO-based layer, wherein one of said pair of adjacent p-n junction forming layers is an n-type epitaxial layer, and the other of said pair of adjacent p-n junction forming layers is a p-type epitaxial layer.

A method for producing a multilayer semiconductor device comprising: providing a reusable substrate base comprising: a Si-based substrate; and a transition lattice comprising two or more alternating transition layers, wherein a first transition layer comprises AlN and overlays said Si-based substrate, and a second transition layer comprises either GaN or GaN doped with Al, and overlays said first transition layer comprising AlN; and then forming a semiconductor stack comprising a pair of adjacent p-n junction forming layers overlaying the reusable substrate base, wherein one of said pair of adjacent p-n junction forming layers is an n-type epitaxial layer, and the other of said pair of adjacent p-n junction forming layers is a p-type epitaxial layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
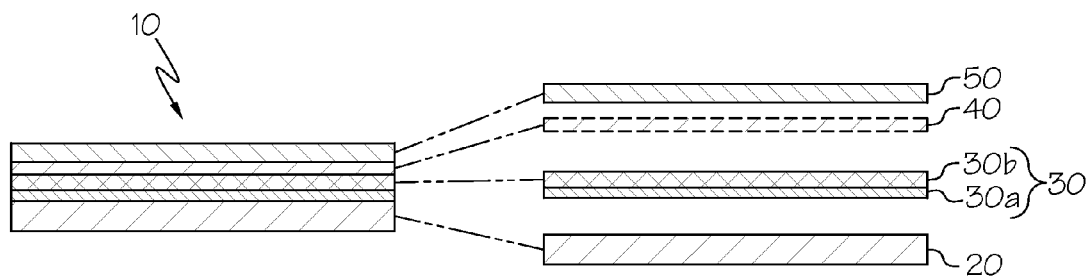
FIG. 1 is a cross-sectional view of an exemplary embodiment of a reusable substrate base showing the various layers thereof, along with an exploded view thereof.

The following detailed description is merely exemplary in nature and is not intended to limit the invention or the application and uses of the invention. Furthermore, there is no intention to be bound by any theory presented in the preceding background or the following detailed description.

As already mentioned, large diameter (e.g., greater than about 15.24 cm (6 inches)) silicon- (Si-) based substrates are promising for the production of gallium nitride (GaN)-based semiconductor devices. However, epitaxial growth of GaN-based epitaxial layers directly on Si substrates without defects such as cracks presents manufacturing difficulties because of large lattice and thermal expansion mismatches. More particularly, the lattice mismatch between crystal Si and GaN is >16%, which causes a high dislocation density in the GaN epitaxial layers. The thermal expansion mismatch between GaN and Si is >50%, which induces tensile stress during the post-growth cooling process and eventually generates cracks in the GaN layers.

Employing an intermediate zinc oxide ZnO-based layer between the Si-based substrate and the semiconductor layers comprising GaN-based epitaxial n-type and p-type layers (collectively referred to hereinafter as a "semiconductor stack") has been found to reduce defects in the layers of the semiconductor stack otherwise derived from the lattice mismatch with the Si-based substrate. It has also been found that first overlaying a transition lattice on the Si-based substrate, prior to the intermediate ZnO-based layer, provides further reduction of defects in the GaN-based semiconductor layers formed thereon. More particularly, where the semiconductor stack will comprise GaN-based n- and p-type epitaxial layers, the transition lattice may be formed with alternating transition layers of aluminum nitride (AlN) and GaN or Al-doped GaN. As used herein, the terms "overlays" and "overlaying" are used to describe the position of a particular layer in the semiconductor relative to a substrate or other layers. When a particular layer is described as "overlaying" a substrate or another layer, this means that either the particular layer is "on" the substrate or other layer such that the particular layer makes physical contact with the substrate or other layer, or the particular layer is "over" the substrate or other layer such that an intervening layer may be positioned between the particular layer and the substrate or other layer.

Furthermore, it has been found to be advantageous to also overlay on the transition lattice a sacrificial layer comprising ZnO. GaN-based epitaxial n-type and p-type layers are then overlayed on the sacrificial ZnO-based layer to produce a multilayer semiconductor device that includes the substrate layers (Si-based substrate, transition lattice layers, and sacrificial ZnO-based layer) and the semiconductor layers (GaN-based n-type and p-type layers). Such a multilayer semiconductor device may then be subjected to a chemical process to remove the ZnO-based sacrificial layer and produce a reusable substrate base (Si-based substrate and transition lattice layers) and a semiconductor device (GaN-based n-type and p-type layers) thereon. The semiconductor device can be used as a light emitting diode (LED) or power transistor. Detailed descriptions of various exemplary embodiments will now be provided.

With reference to FIG. 1, in an exemplary embodiment, a reusable substrate base 10 comprises a Si-based substrate 20, a transition lattice 30, an optional catalyst-bearing layer 40, and a ZnO-based sacrificial layer 50. The Si-based substrate 20 is a single crystal typically comprising one or more compounds selected from the group consisting of: Si(100) and Si(111). The Si-based substrate 20 may have a diameter from about 15.24 to about 38.1 cm (about 6 to about 15 inches). For example, the diameter of the Si-based substrate 20 may be from about 20.32 to about 30.48 cm (about 8 and about 12 inches).

As shown in FIG. 1, the transition lattice 30 overlays the Si-based substrate 20 and comprises alternating transition layers of AlN and GaN or Al-doped GaN. For example, in some embodiments, the transition lattice 30 may comprise a first transition layer 30a comprising AlN, and a second transition layer 30b comprising GaN or Al-doped GaN.

Optionally, the reusable substrate base 10 may also include a catalyst-bearing layer 40 (shown in phantom in the exploded view of FIG. 1) overlaying the transition lattice 30. Where such a catalyst-bearing layer 40 is present, the sacrificial ZnO-based layer overlays the catalyst-bearing layer 40. The catalyst-bearing layer 40 facilitates growth of the epitaxial sacrificial ZnO-based layer 50. The catalyst-bearing layer 40 comprises a metal chosen from: Ti, Ni, Co, Cr, Fe, Mn, Au, Pt, and combinations thereof. In some embodiments, for example, the metal is chosen from Co, Fe and Au, and combinations thereof.

As shown in FIG. 1, overlaying the transition lattice 30 (or the catalyst-bearing layer 40, if present) is the sacrificial ZnO-based layer 50 which may comprise epitaxial ZnO, ZnO nanostructures, or a combination thereof. The ZnO nanostructures are chosen from: nanofibers, nanowires, nanorods, and combinations thereof. Furthermore, the sacrificial ZnO-based layer 50 may comprise undoped ZnO, doped ZnO, or both, where the doped ZnO further comprises one or more elements chosen from Al, Ga, and In. As used herein, "nanostructures" refer to highly oriented, highly crystalline material grown in a particular direction, i.e., the growth is greater in one direction compared to the other two directions of a three-dimensional shape. Nanostructures are typically sized in the nano-scale range of about 5 to about 100 or even greater.

Techniques for growing ZnO-based nanostructures are known to persons of ordinary skill in the art. ZnO is a polar semiconductor with the (0001) planes being Zn-terminated and the (000-1) planes being O-terminated, which means these two crystallographic planes have opposite polarity and hence have different surface relaxation energies. This leads to a higher growth rate along the c-axis, which results in a pillar like structure on Si-based substrates 20. Catalyst-free metal-organic chemical vapor deposition (MOCVD) is one of several effective techniques used to grow ZnO nanostructures. In such a technique, typically a thin nucleation layer of ZnO is grown at a low substrate temperature (e.g., 400° C.) first, followed by annealing. Then ZnO nanostructures are grown on the nucleation layer at a higher substrate temperature (e.g., 650° C.).

Figure 2:
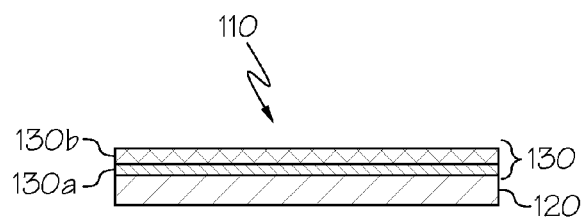
FIG. 2 is a cross-sectional view of another exemplary embodiment of a reusable substrate base after it has been used to fabricate a free-standing semiconductor device and, therefore, without a ZnO-based sacrificial layer.

With reference now to FIG. 2, in another exemplary embodiment the reusable substrate base 110 comprises a Si-based substrate 120 with a transition lattice 130 overlayed thereon, but without a sacrificial ZnO-based layer. Similar to the embodiment shown in FIG. 1, the transition lattice 130 comprises a first transition layer 130a comprising AlN, and a second transition layer 130b comprising GaN or Al-doped GaN. Such embodiments of the reusable substrate base 110 as shown in FIG. 2 (i.e., without a sacrificial ZnO-based layer) are produced when a multilayer semiconductor device having substrate layers (Si-based substrate, transition lattice layers, and sacrificial ZnO-based layer) and a semiconductor stack (GaN-based n-type and p-type layers) (see, e.g., FIGS. 4 and 5) is subjected to a separation or "lift-off" procedure in which the sacrificial ZnO-based layer is removed. As can be seen more clearly in FIG. 5, the removal procedure produces the reusable substrate base 110 (480 in FIG. 5) and a separate free-standing semiconductor 490 (shown only in FIG. 5). After such a removal procedure, the reusable substrate base 110, i.e., having a Si-based substrate 120 with a transition lattice 130 overlayed thereon, but missing the sacrificial ZnO-based layer, is shown in FIG. 2. After lift-off of the free-standing semiconductor (490, FIG. 5), the reusable substrate base 110 is ready for reuse, i.e., as the substrate for fabrication of another free-standing semiconductor device, starting with formation of a new sacrificial ZnO-based layer on the reusable substrate base 110.

Figure 3:
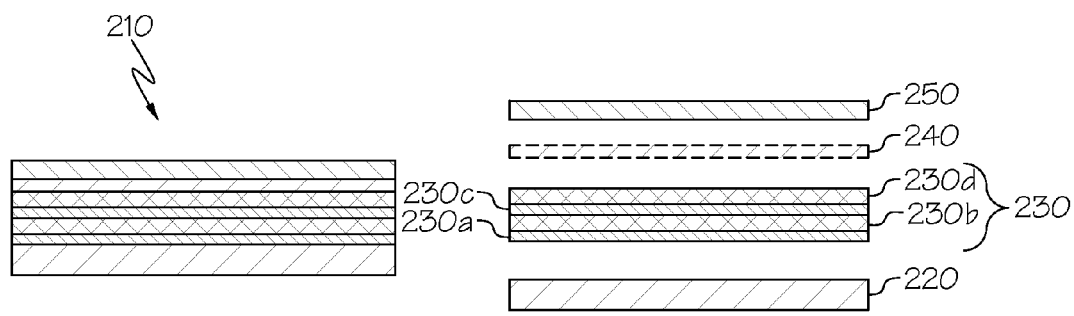
FIG. 3 is a cross-sectional view of another exemplary embodiment of reusable substrate base, similar to that of FIG. 1, but having additional layers in the transition lattice, along with an exploded view thereof.

As shown in FIG. 3, in some embodiments of the reusable substrate base 210, the transition lattice 230 may comprise more than two alternating transition layers. For example, without limitation, the transition lattice 230 may comprise a first transition layer 230a comprising AlN overlaying the Si-based substrate 220, and a second transition layer 230b comprising GaN or Al-doped GaN overlaying the first transition layer 230a, as well as a third transition 230c layer comprising AlN overlaying the second transition layer 230b, and a fourth transition layer 230d comprising GaN or Al-doped GaN overlaying the third transition layer 230c. Furthermore, the transition lattice 230 may comprise additional transition layers beyond these four. Regardless of how many transition layers are present in the transition lattice 230, in an exemplary embodiment, the transition layers 230a, 230b, 230c, 230d are each from about 2 to about 20 nanometers (nm) thick, for example without limitation, from about 5 to about 15 nm, or even from about 5 to about 10 nm thick.

Figure 4:
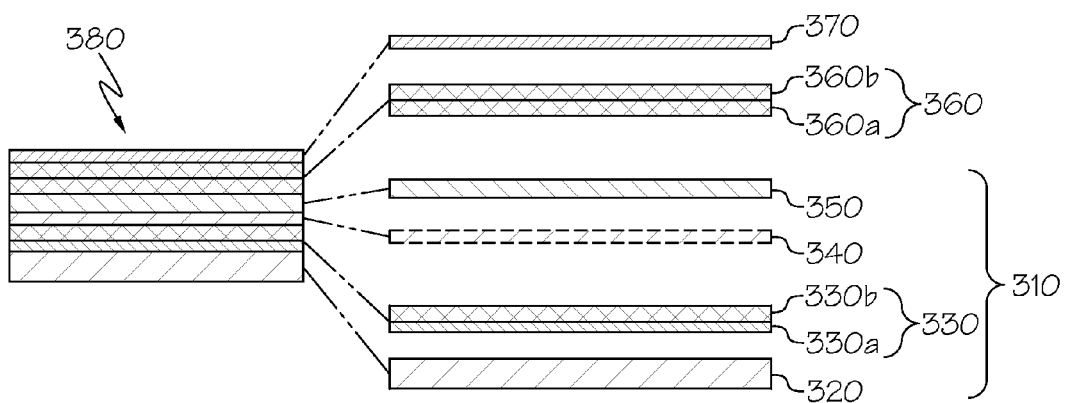
FIG. 4 is a cross-sectional view of an exemplary embodiment of a multilayer semiconductor device including the reusable substrate base, showing the various layers thereof, along with an exploded view thereof.

Turning now to FIG. 4, in a further exemplary embodiment, a multilayer semiconductor device 380 is provided which comprises a reusable substrate base 310, and a semiconductor stack 360 overlaying the reusable substrate base 310. More particularly, similar to the embodiment shown in FIG. 1, the reusable substrate base 310 comprises a Si-based substrate 320, a transition lattice 330, and a sacrificial ZnO-based layer 350. The transition lattice 330 overlays the Si-based substrate 320 and comprises alternating transition layers of AlN and GaN or Al-doped GaN, such as for example, a first transition layer 330a comprising AlN, and a second transition layer 330b comprising GaN or Al-doped GaN. An optional catalyst-bearing layer 340 (shown in phantom in the exploded view of FIG. 4) may also be present, with the sacrificial ZnO-based layer 350 overlayed thereon.

With reference still to FIG. 4, a semiconductor stack 360 overlays the sacrificial ZnO-based layer 350 and comprises a pair of adjacent p-n junction forming layers 360a, 360b. One of the pair adjacent p-n junction forming layers is an n-type epitaxial layer 360a, for example comprising undoped or doped GaN, and overlays the sacrificial ZnO-based layer 350. The other one of the pair of adjacent p-n junction forming layers is a p-type epitaxial layer 360b, for example, comprising undoped or doped GaN, and overlaying the n-type epitaxial layer 360a. Together, the adjacent n- and p-type epitaxial layers 330a, 330b form the semiconductor stack 360 that forms the p-n junction allowing the semiconductor stack 360, to be used as an LED, a power transistor, or another device having semiconductor capabilities.

As will be understood by persons or ordinary skill in the art, the n-type and p-type epitaxial layers 360a, 360b of the semiconductor stack 360 may have compositions that are the same or different from each another. Each of the n- and p-type epitaxial layers 360a, 360b comprises one or more compounds selected from the group consisting of: doped or undoped GaN, doped or undoped ZnO, doped or undoped AlN, doped or undoped AlGaN, doped or undoped InGaN. Determinations of the particular type and amounts of dopants used are well within the ability of persons of ordinary skill in the relevant art.

In addition, as shown in FIG. 4, the multilayer semiconductor device 380 may further comprise a top electrode 370 overlaying the semiconductor stack 360. For example, without limitation, the top electrode 370 may comprise a Ga-doped ZnO epitaxial layer. Such a Ga-doped ZnO epitaxial layer as the electrode 370 would be highly transparent to visible radiation, thereby allowing more of the light output produced to escape the semiconductor stack 360 as compared to conventional metal-containing transparent layers.

It is noted that, as will be readily understood by persons of ordinary skill in the relevant art, while the foregoing embodiments are shown in FIGS. 1, 2 and 3 as having the p-n junction formed by a homojunction, i.e., layers of the same chemical composition such as n-type GaN and p-type GaN, the semiconductor stack 360 described herein may also have its semiconductor layers forming a heterojunction. For example, the n-type epitaxial layer 360a may comprise doped or undoped GaN, while the adjacent p-type epitaxial layer 360b may comprise doped or undoped ZnO, or even vice-versa. Furthermore, one of the p-type and n-type epitaxial layers may comprise a doped metal oxide, while the other may comprise an undoped metal oxide.

In some embodiments, the multilayer semiconductor device 380 further comprises a plurality of quantum dots (not shown) comprising GaN doped with either In or Al. Quantum dots are light emitting nano-scale crystals that are understood and known to persons of ordinary skill in the art. Quantum dots may be formed or deposited in between the p-n junction forming layers (i.e., the n-type and p-type epitaxial layers of the semiconductor stack) to enhance the performance of LEDs having p-n junction-forming layers. Quantum dots may be formed using fabrication techniques known and understood to persons of ordinary skill, such as phase separation and contact-printing.

Another exemplary embodiment provides a method for producing the above-described multilayer semiconductor device 380, such as shown in FIG. 4. The method comprises: providing a reusable substrate base 310, and forming, on the reusable substrate base 310, a semiconductor stack 360 comprising a pair of adjacent p-n junction forming layers 360a, 360b. More particularly, the reusable substrate base 310 comprises: a Si-based substrate 320; and a transition lattice 330 comprising two or more alternating transition layers 330a, 330b, a first one 330a of the alternating transition layers comprising AlN and overlaying said Si-based substrate 320, and a second one 330b of the alternating transition layers comprising either GaN or GaN doped with Al, and overlaying said first transition layer 330a; and a sacrificial ZnO-based layer 350. The semiconductor stack 360 comprising a pair of adjacent p-n junction forming layers 360a, 360b is formed by overlaying an n-type epitaxial layer 360a on the sacrificial ZnO-based layer 350 of the reusable substrate base 310 and then overlaying a p-type epitaxial layer 360b on said n-type epitaxial layer 360a to form a p-n junction. The pair of adjacent p-n junction forming layers 360a, 360b of the semiconductor stack 360 may be formed by using one or more chemical vapor deposition techniques. This method produces the multilayer semiconductor device 380.

In another exemplary embodiment of the method contemplated herein, the step of providing the reusable substrate base 310 involves fabrication of the reusable substrate base 310 by: providing a Si-based substrate 320, overlaying a transition lattice 330 on said Si-based substrate 320, and overlaying a sacrificial ZnO-based layer 350 on said transition lattice 330. Optionally, a catalyst-bearing layer 340 may be overlayed on the transition lattice 330, followed by overlaying the sacrificial ZnO-based layer 350 on the catalyst-bearing layer 340. The various layers of the reusable substrate base 310 may be formed by using one or more chemical vapor deposition techniques.

After forming the reusable substrate base 310 in the aforesaid manner, the n-type epitaxial layer 360a is overlayed on the sacrificial ZnO-based layer 350 of the reusable substrate base 310 and then the p-type epitaxial layer 360b is overlayed on the n-type epitaxial layer 360a to form the semiconductor stack 360 having a p-n junction. Optionally, a top electrode 370 may be overlayed on the semiconductor stack 360. This exemplary embodiment of the method contemplated herein also produces a multilayer semiconductor device 380 as shown in FIG. 4.

In another exemplary embodiment, the method contemplated herein comprises: providing a reusable substrate base 310 comprising a Si-based substrate 320 with a transition lattice 330 overlayed thereon (as shown in FIG. 2); optionally overlaying a catalyst-bearing layer 340 on said transition lattice, and then overlaying a sacrificial ZnO-based layer 350 on either the transition lattice 330 or on the catalyst-bearing layer 340 if present. In this exemplary embodiment, the method further comprises, after forming the sacrificial ZnO-based layer 350, forming a semiconductor stack 360 comprising a pair of adjacent p-n junction forming layers 360a, 360b by overlaying an n-type epitaxial layer 360a on the ZnO-based sacrificial layer 350, and then overlaying a p-type epitaxial layer 360b on said n-type epitaxial layer 360a to form a p-n junction. One or more of the steps of forming the sacrificial ZnO-based layer 350 and forming the semiconductor stack 360 may be performed by one or more chemical vapor deposition techniques.

As will be understood by person having ordinary skill in the relevant art, various vapor deposition techniques may be used to form the various layers of the reusable substrate base and semiconductor devices in accordance with the embodiments described and contemplated herein. For example, without limitation metalorganic vapor phase epitaxy (MOVPE), also known as organometallic vapor phase epitaxy (OMVPE) or metalorganic chemical vapor deposition (MOCVD), is a chemical vapor deposition method suitable for producing single or polycrystalline layers. It is a highly complex process for growing crystalline layers to create complex semiconductor multilayer structures. In contrast to molecular beam epitaxy (MBE), the growth of crystals is by chemical reaction and not physical deposition. This takes place, not in a vacuum, but from the gas phase at moderate pressures (about 10 to about 760 Torr).

Figure 5:
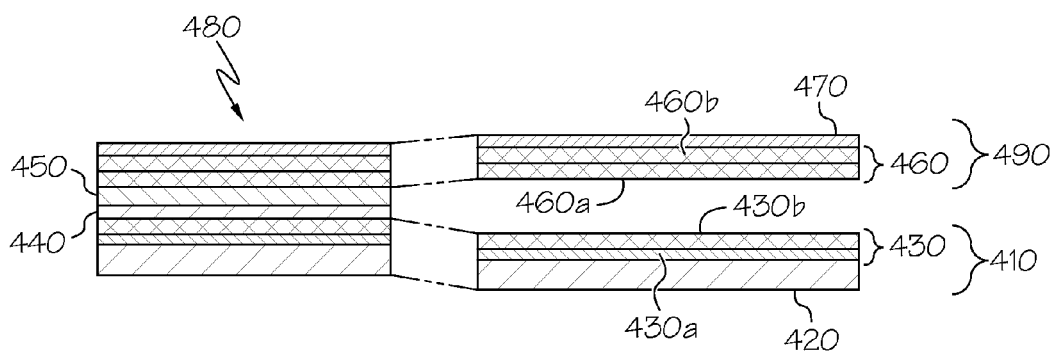
FIG. 5 is a cross-sectional view of an exemplary embodiment of a multilayer semiconductor device, as well as a reusable substrate base and free-standing semiconductor device produced therefrom, along with an exploded view thereof.

With reference to FIG. 5, another exemplary embodiment provides a method for producing a reusable substrate base 410 from a multilayer semiconductor device 480. This method comprises providing a multilayer semiconductor device 480 and selectively removing all or a portion of the sacrificial ZnO-based layer 450 to produce a reusable substrate base 410 and a free-standing semiconductor device 490. In some embodiments, the step of selectively removing all or a portion of the sacrificial ZnO-based layer 450 may be performed using an etching process, such as acid etching. As shown in FIG. 5, the multilayer semiconductor device 480 comprises a Si-based substrate 420, a transition lattice 430, a sacrificial ZnO-based layer 450, a semiconductor stack 460 comprising a pair of adjacent p-n junction forming layers 460a, 460b. Optionally, the multilayer semiconductor device 480 may further comprise a catalyst-bearing layer 440, as well as an optional top electrode 470.

After all or a portion of the sacrificial ZnO-based layer 450 has been removed, the resulting free standing semiconductor device 490 comprises a semiconductor stack 460 having a pair of adjacent p-n junction forming layers wherein one of the pair 460a is an n-type epitaxial layer, and the other 460b is a p-type epitaxial layer. In some embodiments, each of the pair of adjacent p-n junction forming layers 460a, 460b may comprise undoped or doped GaN. The free standing semiconductor device 490 may be used in an LED or a power transistor.

The reusable substrate base 410 resulting from the aforesaid removal step is similar to the embodiment shown in FIG. 2 and comprises a Si-based substrate 420 with a transition lattice 430 overlayed thereon. The reusable substrate base 410 does not include a sacrificial ZnO-based layer, since it is partially or entirely destroyed by a chemical process, such as an etching process, to remove it, as described above. The reusable substrate base 410 may be used to produce another multilayer semiconductor device, such as by the method described above, beginning with formation of a new sacrificial ZnO-based layer on which a new semiconductor stack may be formed.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

The following is an exemplary embodiment of GaN-based semiconductor stack useful in an LED device. More particularly, adjacent GaN-based p-n junction forming layers were deposited on a reusable substrate base. The reusable substrate base comprised an Si(111) substrate having buffer layers (e.g., the transition lattice) of AlN and AlGaN overlayed thereon, with a ZnO-based sacrificial epitaxial layer overlaying the buffer layers. The example is provided for illustration purposes only and is not meant to limit the various embodiments herein in any way.

EXAMPLE

An Si(111) polished substrate of 20.32 cm (8 inch) diameter is chemically cleaned using $H_2SO_4/H_2O_2$ solution and treated with buffered HF solution. An MOCVD (metal organic chemical vapor deposition) reactor is used for depositing all the proposed layers. Multilayers of AlN and GaN alternate epitaxial films, of few nanometers thick each, are grown on top of the substrate using tri-methyl-aluminum and tr-methyl-gallium as a precursors and ammonia as a nitridation source. On top of these layers, ZnO epitaxial layer is grown using zinc acetate as precursor for zinc, and $H_2$, $N_2$ and oxygen partial pressure as carrier gas. GaN epitaxial layer with Si as n-type dopant is grown using $SiH_4$ as a precursor gas. On top of this n-type GaN layer, a p-type GaN epitaxial layer is grown employing bis-cyclopentadienyl-magnesium (Cp2Mg) as Mg precursor. Ga doped ZnO epitaxial layer of a few microns thick is grown to act as top electrode. A metal electrode is deposited on top of these structures using conventional compositions.

What is claimed is:

1. A reusable substrate base useful for production of semiconductor devices comprising:
    a Si-based substrate;
    a transition lattice overlaying said Si-based substrate and comprising two or more alternating transition layers, wherein the alternating transition layers comprise a first transition layer that comprises AlN and that overlays said Si-based substrate, and a second transition layer that comprises either GaN or GaN doped with Al, and that overlays said first transition layer comprising AlN;
    a sacrificial ZnO-based layer that overlays said transition lattice; and
    a catalyst-bearing layer that overlays the transition lattice and that is overlayed by said sacrificial ZnO-based layer.

2. The reusable substrate base of claim 1, wherein said transition lattice further comprises a third transition layer comprising AlN and overlaying said second transition layer, and a fourth transition layer comprising either GaN or GaN doped with Al and overlaying said third transition layer.

3. The reusable substrate base of claim 1, wherein said sacrificial ZnO-based layer comprises either epitaxial ZnO or ZnO nanostructures.

4. A multilayered semiconductor device comprising:
    a reusable substrate base comprising:
    a Si-based substrate;
    a transition lattice overlaying said Si-based substrate and comprising two or more alternating transition layers, wherein a first transition layer comprises AlN and overlays said Si-based substrate, and a second transition layer comprises either GaN or GaN doped with Al, and overlays said first transition layer comprising AlN; and
    a sacrificial ZnO-based layer which overlays said transition lattice; and
    a semiconductor stack comprising a pair of adjacent p-n junction forming layers overlaying said sacrificial ZnO-based layer, wherein one of said pair of adjacent p-n junction forming layers is an n-type epitaxial layer, and the other of said pair of adjacent p-n junction forming layers is a p-type epitaxial layer; and a catalyst-bearing layer which overlays the transition lattice and which is overlayed by said sacrificial ZnO-based layer.

5. The multilayer semiconductor device of claim 4, further comprising a top electrode overlaying said semiconductor stack.

6. The multilayer semiconductor device of claim 4, wherein said transition lattice further comprises a third transition layer comprising AlN and overlaying said second transition layer, and a fourth transition layer comprising either AlN, GaN or GaN doped with Al and overlaying said third transition layer.

7. The multilayer semiconductor device of claim 4, wherein said sacrificial ZnO-based layer comprises epitaxial ZnO, ZnO nanostructures, or a combination thereof.

8. The multilayer semiconductor device of claim 4, further comprising a plurality of quantum dots comprising GaN doped with either In or Al.

9. The multilayer semiconductor device of claim 4, wherein the multilayer semiconductor device is a light emitting diode (LED) or a power transistor.

10. A method for producing a multilayered semiconductor device comprising:
    providing a reusable substrate base comprising:
    a Si-based substrate; and
    a transition lattice comprising two or more alternating transition layers, wherein a first transition layer comprises AlN and overlays said Si-based substrate, and a second transition layer comprises either GaN or GaN doped with Al, and overlays said first transition layer comprising AlN;
    forming a semiconductor stack comprising a pair of adjacent p-n junction forming layers overlaying the reusable substrate base, wherein one of said pair of adjacent p-n junction forming layers is an n-type epitaxial layer, and the other of said pair of adjacent p-n junction forming layers is a p-type epitaxial layer;
    wherein said reusable substrate base further comprises a sacrificial ZnO-based layer overlaying said transition lattice; and
    prior to forming said sacrificial ZnO-based layer, forming a catalyst-bearing layer overlaying said transition lattice, followed by forming said sacrificial ZnO-based layer overlaying said catalyst-bearing layer.

11. The method of claim 10, further comprising, after all forming steps are performed, selectively removing all or a portion of said sacrificial ZnO-based layer to separate the reusable substrate base and form a free-standing semiconductor device.

12. The method of claim 10, comprising, prior to forming said semiconductor stack,
    forming said sacrificial ZnO-based layer overlaying said transition lattice; and
    forming said semiconductor stack overlaying said sacrificial ZnO-based layer.

13. The method of claim 12, further comprising, after all forming steps are performed, selectively removing all or a portion of said sacrificial ZnO-based layer to separate the reusable substrate base form a free-standing semiconductor device.

14. The method of claim 10, wherein the step of providing the reusable substrate base comprises fabrication of the reusable substrate base by:
    providing the Si-based substrate; forming said transition lattice overlaying said Si-based substrate; and forming said sacrificial ZnO-based layer overlaying said transition lattice.

15. The method of claim 14, wherein fabrication of the reusable substrate base further comprises forming a catalyst-bearing layer overlaying said transition lattice, followed by forming said sacrificial ZnO-based layer overlaying said catalyst-bearing layer.

* * * * *